US009330750B2

(12) United States Patent
Lee

(10) Patent No.: US 9,330,750 B2
(45) Date of Patent: May 3, 2016

(54) INTEGRATED CIRCUIT USING METHOD FOR SETTING LEVEL OF REFERENCE VOLTAGE

(75) Inventor: Jeong Hun Lee, Daejeon-si (KR)

(73) Assignee: SK HYNIX INC., Icheon-si (KR)

(*) Notice: Subject to any disclaimer, the term of this patent is extended or adjusted under 35 U.S.C. 154(b) by 1232 days.

(21) Appl. No.: 13/033,685

(22) Filed: Feb. 24, 2011

(65) Prior Publication Data

US 2012/0008431 A1   Jan. 12, 2012

(30) Foreign Application Priority Data

Jul. 8, 2010   (KR) .................. 10-2010-0066048

(51) Int. Cl.
G11C 11/4072   (2006.01)
G11C 5/14   (2006.01)
G11C 11/406   (2006.01)
G11C 11/4074   (2006.01)
H03K 5/08   (2006.01)
H03M 1/76   (2006.01)

(52) U.S. Cl.
CPC ............ G11C 11/4072 (2013.01); G11C 5/147 (2013.01); G11C 11/406 (2013.01); G11C 11/4074 (2013.01); G11C 11/40615 (2013.01); H03K 5/08 (2013.01); H03M 1/765 (2013.01)

(58) Field of Classification Search
CPC ...... G11C 5/147; G11C 5/148; G11C 11/406; G11C 11/40615; G11C 11/4072; G11C 11/4074; H03K 5/08; H03M 1/765

USPC ............... 365/149, 189.09, 222, 228
See application file for complete search history.

(56) References Cited

U.S. PATENT DOCUMENTS

| 5,699,063 | A * | 12/1997 | Takayama ............ 341/118 |
| 6,897,684 | B2 * | 5/2005 | Oi et al. ............ 326/86 |
| 8,000,160 | B2 * | 8/2011 | Jung ............ 365/201 |
| 2004/0051557 | A1 * | 3/2004 | Kim ............ 326/82 |
| 2007/0188430 | A1 | 8/2007 | Moon |
| 2010/0034031 | A1 * | 2/2010 | Kang et al. ............ 365/189.09 |
| 2010/0061160 | A1 * | 3/2010 | Jeong ............ 365/189.07 |
| 2012/0256675 | A1 * | 10/2012 | Lee ............ 327/333 |

FOREIGN PATENT DOCUMENTS

| KR | 10818703 B1 | 3/2008 |
| KR | 100949271 B1 | 3/2010 |
| KR | 1020100028684 A | 3/2010 |

* cited by examiner

*Primary Examiner* — Harry W Byrne
*Assistant Examiner* — Lance Reidlinger
(74) *Attorney, Agent, or Firm* — William Park & Associates Ltd.

(57) ABSTRACT

An integrated circuit includes a reference voltage level setting circuit and a reference voltage generation circuit. The reference voltage level setting circuit is configured to set a level of an input reference voltage to a preset level in a power-up period or a self-refresh mode. The reference voltage generation circuit is configured to select one of a plurality of reference voltages and output the selected reference voltage as the input reference voltage when the power-up period is ended and an operation mode is not in the self-refresh mode.

5 Claims, 5 Drawing Sheets

INTEGRATED CIRCUIT USING METHOD FOR SETTING LEVEL OF REFERENCE VOLTAGE

CROSS-REFERENCES TO RELATED APPLICATIONS

The present application claims priority under 35 U.S.C 119(a) to Korean Application No. 10-2010-0066048, filed on Jul. 8, 2010, in the Korean intellectual property Office, which is incorporated herein by reference in its entirety set forth in full.

TECHNICAL FIELD

The present invention is related to an integrated circuit using method for setting level of reference voltage.

BACKGROUND

Circuits included in an integrated circuit transmit and receive digital signals including data. A circuit which receives a digital signal determines whether the digital signal is a logic high level or a logic low level by comparing a level of a reference voltage with a level of the digital signal by using an input buffer which includes a comparator configured with a differential amplifier.

The reference voltage is set to a middle value between a potential defining a logic high level and a potential defining a logic low level, and serves as an absolute voltage which discriminates the logic level of the inputted digital signal.

In general, a reference voltage generation circuit starts to operate after a power-up period has ended, and selects one level among a plurality of levels, which are generated by a voltage division through a plurality of resistors, as a level of a reference voltage.

The reference voltage generation circuit operating in the above-described manner continuously maintains an enabled state after the power-up period is ended. Hence, a large amount of current is consumed, and it takes a long time to raise the reference voltage to the selected level.

SUMMARY

An embodiment of the present invention relates to an integrated circuit using a method for setting a level of a reference voltage, which is capable of reducing current consumption and time taken to set a level of a reference voltage.

In one embodiment, an integrated circuit includes: a reference voltage level setting circuit configured to set a level of an input reference voltage to a preset level in a power-up period or a self-refresh mode; and a reference voltage generation circuit configured to select one of a plurality of reference voltages, and output the selected reference voltage as the input reference voltage based on a power-up period and operation mode.

In another embodiment, an integrated circuit includes: a memory control circuit configured to apply data and a command; and a semiconductor memory device configured to receive the data and the command, set an input reference voltage to a level of a first reference voltage, whose level is selected by decoding a selection signal, as the input reference voltage when an operation mode is not in the self-refresh mode after the power-up period is ended, and set the input reference voltage to a level of a second reference voltage in a power-up period or a self-refresh mod.

In another embodiment, an integrated circuit includes: a memory control circuit that applies data, a command, and a first reference voltage; and a semiconductor memory device that receives the data and command and sets an input reference voltage to a preset level based on an operation mode, and transfers the first reference voltage as the input reference voltage depending on the operation mode.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
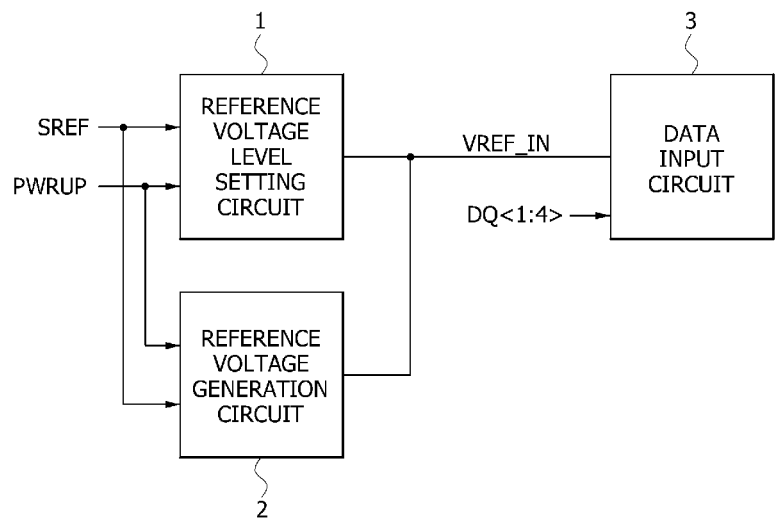
FIG. 1 is a block diagram illustrating a configuration of a semiconductor memory device according to an embodiment of the present invention.

FIG. 1 is a block diagram illustrating a configuration of a semiconductor memory device according to an embodiment of the present invention.

As illustrated in FIG. 1, the semiconductor memory device according to an embodiment includes a reference voltage level setting circuit 1, a reference voltage generation circuit 2, and a data input circuit 3.

Figure 2:
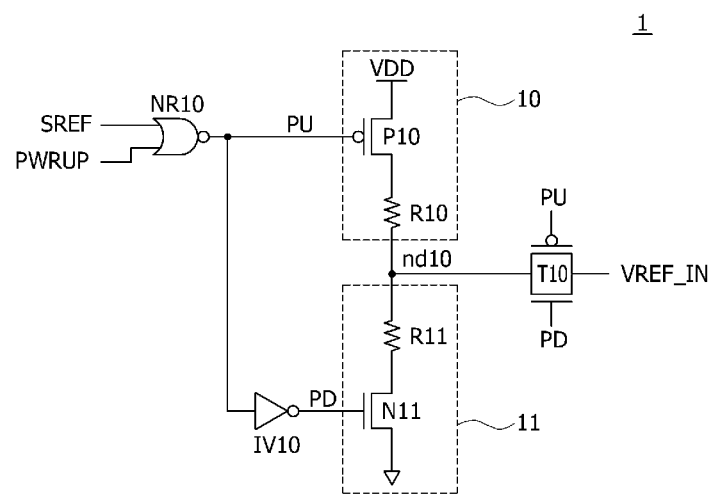
FIG. 2 is a circuit diagram illustrating a reference voltage level setting circuit included in the semiconductor memory device of FIG. 1.

As illustrated in FIG. 2, the reference voltage level setting circuit 1 includes a NOR gate NR10, a pull-up driving unit 10, a pull-down driving unit 11, and a transfer gate T10. The NOR gate NR10 operates as a pull-up signal generation unit configured to receive a self-refresh signal SREF and a power-up signal PWRUP, and generate a pull-up signal PU which is enabled to a logic low level in a power-up period or a self-refresh mode. The self-refresh signal SREF is enabled to a logic high level in the self-refresh mode, and the power-up signal PWRUP has a logic high level in the power-up period and changes to a logic low level after the power-up period is ended. The pull-up driving unit 10 includes a PMOS transistor P10 and a resistor R10, and pull-up drives a middle node nd10 in response to the pull-up signal PU. The pull-down driving unit 11 includes an NMOS transistor N11 and a resistor R11, and pull-down drives the middle node nd10 in response to a pull-down signal PD which is generated by inverting and buffering the pull-up signal PU through an inverter IV10. When the pull-up signal PU is at a logic low level and the pull-down signal PD is at a logic high level, the transfer gate T10 is turned on to transfer the signal of the middle node nd10 as an input reference voltage VREF_IN. The PMOS transistor P10 and the NMOS transistor N11 may be designed to have the same turn-on resistance, and the resistor R10 and the resistor R11 may be designed to have the same resistance.

When the semiconductor memory device enters the power-up period or the self-refresh mode, the PMOS transistor P10 and the NMOS transistor N11 of the reference voltage level setting circuit 1 configured as above drives the node nd10 to a middle level between a power supply voltage VDD and a ground voltage VSS. The PMOS transistor P10 and the NMOS transistor N11 are turned on by the pull-up signal PU of a logic low level and the pull-down signal PD of a logic high level to drive the node nd10 to the described middle level. Also, the reference voltage level setting circuit 1 transfers the signal of the node nd10 as the input reference voltage VREF_IN through the transfer gate T10 which are turned on by the pull-up signal PU of a logic low level and the pull-down signal PD of a logic high level. If the semiconductor memory device is not in the self-refresh mode after the power-up period, the pull-up signal PU is enabled to a logic high level and the pull-down signal PD is enabled to a logic low level. Thus, the operation of the reference voltage level setting circuit 1 is stopped because both of the PMOS transistor P10 and the NMOS transistor N11 are turned off.

Figure 3:
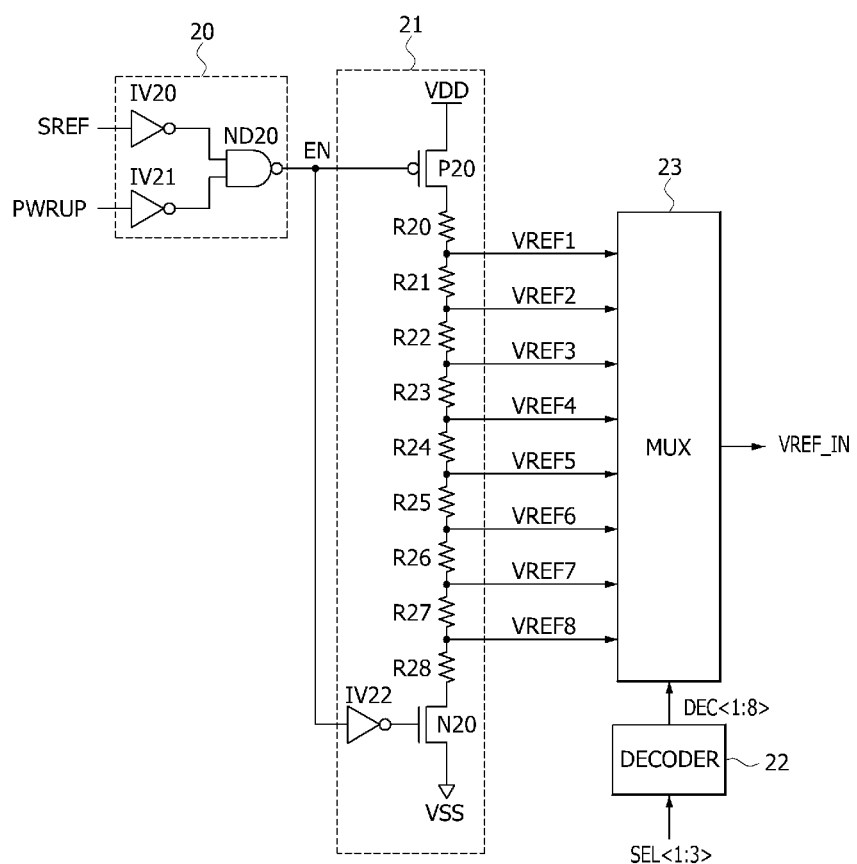
FIG. 3 is a circuit diagram illustrating a reference voltage generation circuit included in the semiconductor memory device of FIG. 1.

As illustrated in FIG. 3, the reference voltage generation circuit 2 includes an enable signal generation unit 20, a voltage division unit 21, a decoder 22, and a multiplexer 23. The enable signal generation unit 20 includes an inverter IV20, an inverter IV21, and a NAND gate ND20. The inverter IV20 is configured to invert and buffer the self-refresh signal SREF. The inverter IV21 is configured to invert and buffer the power-up signal PWRUP. The NAND gate ND20 is configured to perform a NAND operation on output signals of the inverters IV20 and IV21 and generate an enable signal EN. The voltage division unit 21 includes an inverter IV22, a PMOS transistor P20, an NMOS transistor N20, and a plurality of resistors R20 to R28. The inverter IV22 is configured to invert and buffer the enable signal EN. The PMOS transistor P20 and the NMOS transistor N20 are turned on when the enable signal EN is at a logic low level. The plurality of resistors R20 to R28 are configured to divide the power supply voltage VDD and generate first to eighth reference voltages VREF1 to VREF8. The decoder 22 is configured to decode first to third selection signals SEL<1:3> and generate first to eighth decoding signals DEC<1:8> which are selectively enabled. The combination of the first to eighth decoding signals DEC<1:8> which are selectively enabled depending on the logic level combination of the first to third selection signals SEL<1:3> may be variously set according to embodiments. A memory control circuit set the logic level combination of the first to third selection signals SEL<1:3> in MRS (Mode Register Setting). The multiplexer 23 is configured to select one of the first to eighth reference voltages VREF1 to VREF8 in response to the first to eighth decoding signals DEC<1:8> and output the selected reference voltage as the input reference voltage VREF_IN. One of the first to eighth reference voltages VREF1 to VREF8 which is outputted as the input reference voltage VREF_IN depending on the first to eighth decoding signals DEC<1:8> may be variously set according to embodiments.

When the semiconductor memory device is not in the self-refresh mode after the power-up period is ended the self-refresh signal SREF is enabled to a logic low level and the power-up signal PWRUP is enabled to a logic low level. Therefore, enable signal EN is a logic low level and drives the voltage division unit 21 of the reference voltage generation circuit 2 to generate the first to eighth reference voltages VREF1 to VREF8. One of the first to eighth reference voltages VREF1 to VREF8 is outputted as the input reference voltage VREF_IN, depending on the logic level combination of the first to third selection signals SEL<1:3>.

Figure 4:
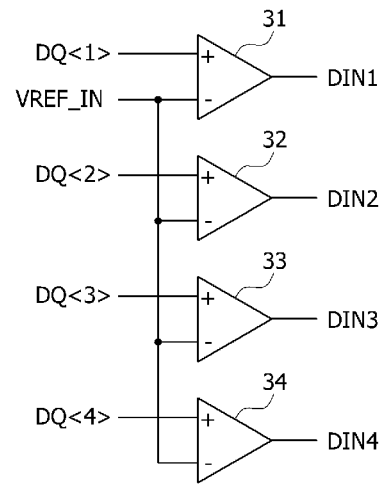
FIG. 4 is a circuit diagram illustrating a data input circuit included in the semiconductor memory device of FIG. 1.

As illustrated in FIG. 4, the data input circuit 3 includes a first comparator 31, a second comparator 32, a third comparator 33, and a fourth comparator 34. The first comparator 31 is configured to compare the input reference voltage VREF_IN with a first data DQ<1> and generate a first input data DIN1. The second comparator 32 is configured to compare the input reference voltage VREF_IN with a second data DQ<2> and generate a second input data DIN2. The third comparator 33 is configured to compare the input reference voltage VREF_IN with a third data DQ<3> and generate a third input data DIN3. The fourth comparator 34 is configured to compare the input reference voltage VREF_IN with a fourth data DQ<4> and generate a fourth input data DIN4. The first to fourth comparators 31 to 34 may be implemented with differential amplification circuits.

The data input circuit 3 configured as above buffers the first to fourth data DQ<1:4> in response to the input reference voltage VREF_IN and outputs the first to fourth input data DIN1 to DIN4.

The operation of the semiconductor memory device according to an embodiment of the present invention is described below. The description is focused on the method for setting the level of the input reference voltage VREF_IN.

First, in the power-up period, the power-up signal PWRUP has a logic high level thus the reference voltage level setting circuit 1 generates the pull-up signal PU of a logic low level and the pull-down signal PD of a logic high level. Because the pull-up signal PU is a logic low level and the pull-down signal PD is a logic high level the circuit 1 drives the input reference voltage VREF_IN to a middle level between the power supply voltage VDD and the ground voltage VSS. At this time, since the enable signal EN of the reference voltage generation circuit 2 is generated at a logic high level, the driving of the voltage division unit 21 is stopped. Therefore, in the power-up period, reference voltage level setting circuit 1 drives the input reference voltage VREF_IN to a middle level between the power supply voltage VDD and the ground voltage VSS.

Next, when the semiconductor memory device is not in the self-refresh mode after the power-up period is ended, both of the power-up signal PWRUP and the self-refresh signal SREF are at a logic low level. Therefore, the enable signal EN is enabled to a logic low level and drives the voltage division unit 21 in the reference voltage generation circuit 2. The reference voltage generation circuit 2 accordingly generates the first to eighth reference voltages VREF1 to VREF8. One of the first to eighth reference voltages VREF1 to VREF8 is outputted as the input reference voltage VREF_IN, depending on the logic level combination of the first to third selection signals SEL<1:3>. That is, the input reference voltage VREF_IN is driven to one level of the first to eighth reference voltages VREF1 to VREF8. At this time, since the input reference voltage VREF_IN is driven to a middle level between the power supply voltage VDD and the ground voltage VSS in the power-up period, the level setting can be quickly achieved. Therefore, current consumption necessary to set the level of the input reference voltage VREF_IN is reduced. Meanwhile, because the memory device is not in the self-refresh mode and the power-up period has ended, the pull-up signal PU has a logic high level and the pull-down signal PD has a logic low level. Thus the operation of the reference voltage level setting circuit 1 is stopped.

Next, when the semiconductor memory device enters the self-refresh mode after the power-up period is ended, the reference voltage level setting circuit 1 is enabled by the self-refresh signal SREF which changes to a logic high level, and drives the input reference voltage VREF_IN to a middle level between the power supply voltage VDD and the ground voltage VSS. At this time, the operation of the reference voltage generation circuit 2 is stopped by the enable signal EN which is disabled to a logic high level.

Next, when the semiconductor memory device exits the self-refresh mode, the operation of the reference voltage level setting circuit 1 is stopped, and the reference voltage generation circuit 2 receives the first to third selection signals SEL<1:3> and sets the level of the input reference voltage VREF_IN to one level of the first to eighth reference voltages VREF1 to VREF8. At this time, since the input reference voltage VREF_IN is driven to a middle level between the power supply voltage VDD and the ground voltage VSS in the self-refresh mode, the level setting can be quickly achieved. Therefore, current consumption necessary to set the level of the input reference voltage VREF_IN is reduced.

Figure 5:
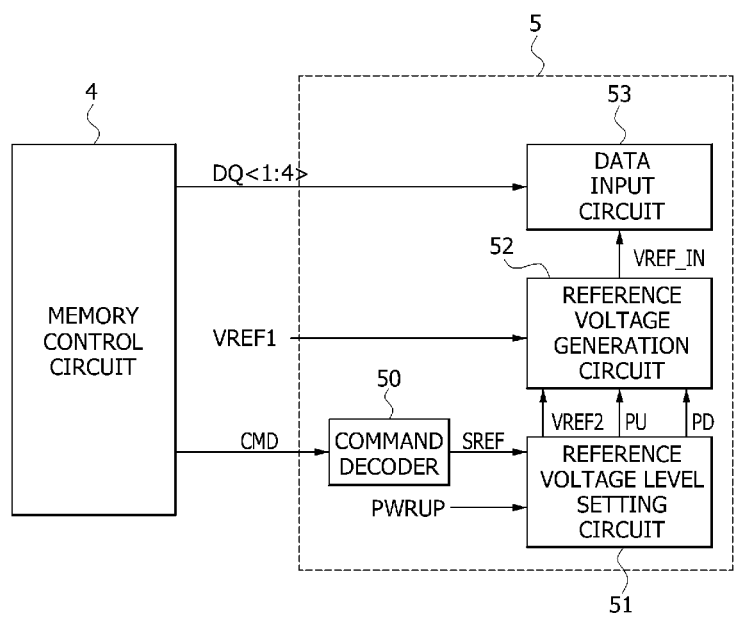
FIG. 5 is a block diagram illustrating a configuration of an integrated circuit according to an embodiment of the present invention.

FIG. 5 is a block diagram illustrating a configuration of an integrated circuit according to an embodiment of the present invention.

As illustrated in FIG. 5, the integrated circuit according to an embodiment of the present invention includes a memory control circuit 4 and a semiconductor memory device 5. The memory control circuit 4 applies first to fourth data DQ<1:4> and a command CMD. The semiconductor memory device 5 includes a command decoder 50, a reference voltage level setting circuit 51, a reference voltage selection/transfer unit 52, and a data input circuit 53.

The command decoder 50 is configured to decode the command CMD and generate a self-refresh signal SREF which is enabled to a logic high level in a self-refresh mode.

Figure 6:
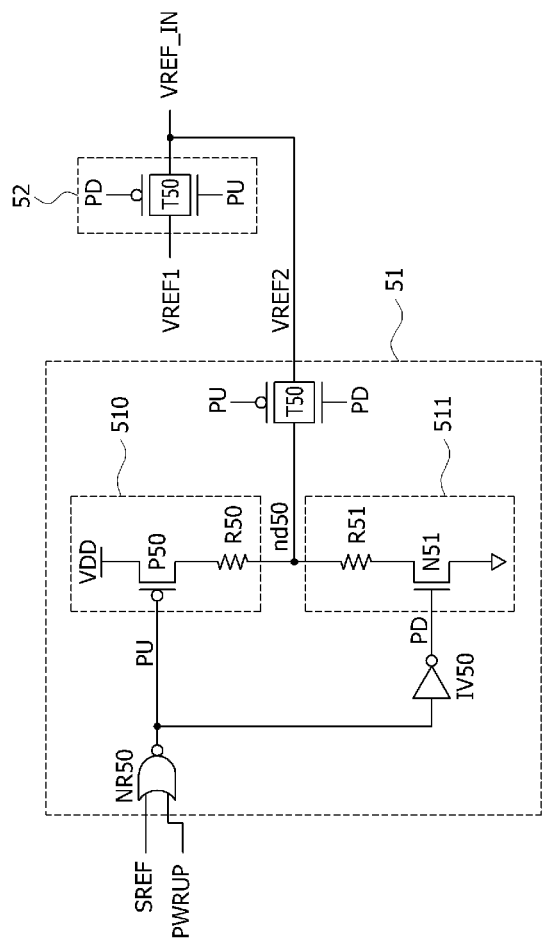
FIG. 6 is a circuit diagram illustrating a reference voltage level setting circuit and a reference voltage selection/transfer unit included in the integrated circuit of FIG. 5.

As illustrated in FIG. 6, the reference voltage level setting circuit 51 includes a NOR gate NR50, a pull-up driving unit 510, a pull-down driving unit 511, and a transfer gate T50. The NOR gate NR50 operates as a pull-up signal generation unit configured to receive the self-refresh signal SREF and a power-up signal PWRUP, and generate a pull-up signal PU which is enabled to a logic low level in a power-up period or a self-refresh mode. The pull-up driving unit 510 includes a PMOS transistor P50 and a resistor R50, and pull-up drives a middle node nd50 in response to the pull-up signal PU. The pull-down driving unit 511 includes an NMOS transistor N51 and a resistor R51, and pull-down drives the middle node nd50 in response to a pull-down signal PD which is generated by inverting and buffering the pull-up signal PU through an inverter IV50. When the pull-up signal PU is at a logic low level and the pull-down signal PD is at a logic high level, the transfer gate T50 is turned on to transfer the signal of the middle node nd50 as a second reference voltage VREF2. The PMOS transistor P50 and the NMOS transistor N51 may be designed to have the same turn-on resistance, and the resistor R50 and the resistor R51 may be designed to have the same resistance.

When the integrated circuit enters the power-up period or the self-refresh mode, the reference voltage level setting circuit 51 configured as above drives the node nd50 to a middle level between a power supply voltage VDD and a ground voltage VSS. The node nd50 is driven to the middle level because when the integrated circuit enters the power-up period or the self-refresh mode, the pull-up signal PU is a logic low level and the pull-down signal PD is a logic high level, therefore the PMOS transistor P50 and the NMOS transistor N51 are turned on which drives the node nd50 to the middle level. Because the pull-up signal PU is at a logic low and the pull-down signal is at a logic high, the reference voltage generation circuit 52 is in a disabled state. Therefore, the reference voltage level setting circuit 51 transfers the signal of the node nd50 as the input reference voltage VREF_IN through the transfer gate T50 which are turned on by the pull-up signal PU of a logic low level and the pull-down signal PD of a logic high level.

As illustrated in FIG. 6, when the integrated circuit does not enter the self-refresh mode after the power-up period the operation of the reference voltage level setting circuit 51 is stopped because both of the PMOS transistor P50 and the NMOS transistor N51 are turned off by the pull-up signal PU of a logic high level and the pull-down signal PD of a logic low level. Because the reference voltage level setting circuit 51 is in a disabled state, the reference voltage section/transfer unit 52 transfers the first reference voltage VREF1 as the input reference voltage VREF_IN by the transfer gate T50 which is turned on by the pull-up signal PU of a logic high level and the pull-down signal PD of a logic low level. The first reference voltage VREF1 is applied from the outside of the semiconductor memory device 5. In some embodiments, a preset voltage may be applied as the first reference voltage VREF1 through a pad of the semiconductor memory device 5, or the first reference voltage VREF1 may be generated by a reference voltage generation circuit (not shown) provided at the outside of the semiconductor memory device 5.

The data input circuit 53 is configured to buffer the first to fourth data DQ<1:4> in response to the input reference voltage VREF_IN, where data DQ<1:4> are applied from the memory control circuit 4. The data input circuit 53 may be implemented with the same circuit configuration as that of FIG. 4.

When the integrated circuit enters the power-up period or the self-refresh mode, the reference voltage level setting circuit 51 drives the input reference voltage VREF_IN to a middle level between the power supply voltage VDD and the ground voltage VSS.

Therefore, after the power-up period or when the integrated circuit exits the self-refresh mode, the input reference voltage VREF_IN can be quickly set to the level of the first reference voltage VREF1 inputted from the outside. Hence, current consumption necessary to set the level of the input reference voltage VREF_IN can be reduced.

Figure 7:
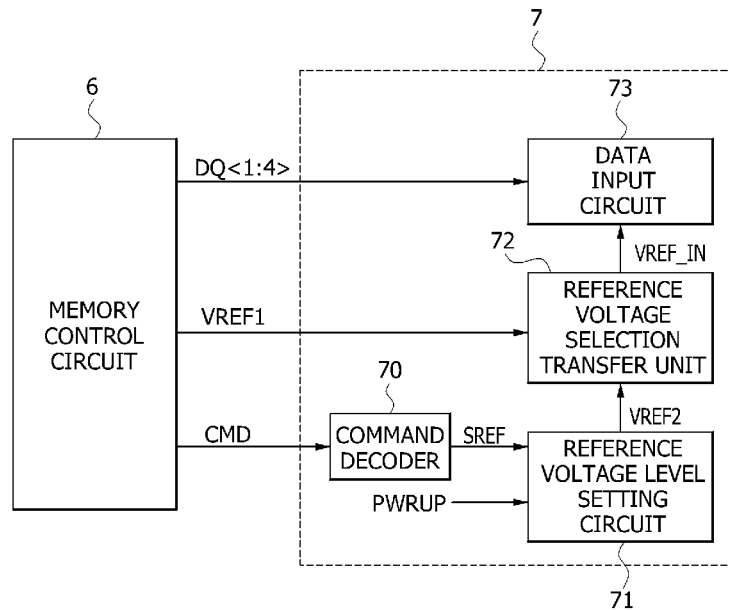
FIG. 7 is a block diagram illustrating a configuration of an integrated circuit according to another embodiment of the present invention.

FIG. 7 is a block diagram illustrating a configuration of an integrated circuit according to another embodiment of the present invention.

As illustrated in FIG. 7, the integrated circuit according to an embodiment of the present invention includes a memory control circuit 6 and a semiconductor memory device 7. The memory control circuit 6 applies first to fourth data DQ<1:4>, a first reference voltage VREF1, and a command CMD. The semiconductor memory device 7 includes a command decoder 70, a reference voltage level setting circuit 71, a reference voltage selection/transfer unit 72, and a data input circuit 73.

The command decoder 70 is configured to decode the command signal CMD and generates a self-refresh signal SREF which is enabled to a logic high level in a self-refresh mode.

The reference voltage level setting circuit 71 may be implemented with the same circuit configuration as the reference voltage level setting circuit 51 illustrated in FIG. 6. However, in this embodiment, the reference voltage level setting circuit 71 does not transfer a pull-up signal PU and a pull-down signal PD to the reference voltage selection/transfer unit 72.

Figure 8:
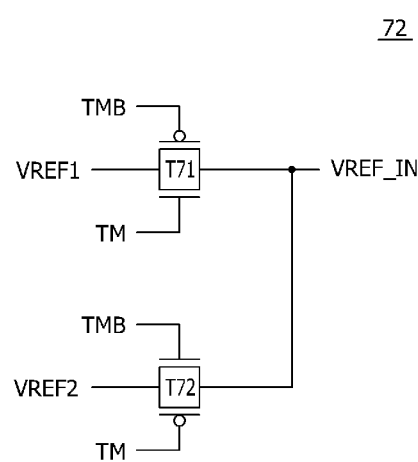
FIG. 8 is a circuit diagram illustrating a reference voltage selection/transfer unit included in the integrated circuit of FIG. 7.

As illustrated in FIG. 8, the reference voltage selection/transfer unit 72 includes transfer gates T71 and T72 configured to be selectively turned on in response to a test mode signal TM and an inverted test mode signal TMB, and transfers the first reference voltage VREF1 or the second reference voltage VREF2 as the input reference voltage VREF_IN depending on how the test model signal TM and inverted test mode signal TMB are set.

The data input circuit 73 is configured to buffer the first to fourth data DQ<1:4> applied from the memory control circuit 6 in response to the input reference voltage VREF_IN. The data input circuit 73 may be implemented with the same circuit configuration as the data input circuit 53 illustrated in FIG. 4.

When the integrated circuit enters the power-up period or the self-refresh mode, the reference voltage level setting circuit 71 drives the second reference voltage VREF2 to a middle level between the power supply voltage VDD and the ground voltage VSS. Meanwhile, in this embodiment, the semiconductor memory device 7 included in the integrated circuit receives the first reference voltage VREF1 applied from the memory control circuit 6 and selectively transfers the first reference voltage VREF1 or the second reference voltage VREF2 as the input reference voltage VREF_IN in response to the test mode signal TM.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit comprising:
    a reference voltage level setting circuit configured to set a level of an input reference voltage to a middle level between a power supply voltage and a ground voltage in a power-up period or a self-refresh mode; and
    a reference voltage generation circuit configured to select one of a plurality of reference voltages and output the selected reference voltage as the input reference voltage when the power-up period is ended and an operation mode is not in the self-refresh mode,
    wherein the reference voltage level setting circuit includes a pull-up signal generation unit configured to receive a power-up signal and a self-refresh signal to generate a pull-up signal enabled in the power-up period or the self-refresh mode and a transfer element configured to transfer a signal of a middle node as the input reference voltage in response to the pull-up signal and a pull-down signal.

2. The integrated circuit of claim 1, wherein the reference voltage level setting circuit further comprises:
    a pull-up driving unit configured to pull-up drive the middle node in response to the pull-up signal; and
    a pull-down driving unit configured to pull-down drive the middle node in response to the pull-down signal which is generated by buffering the pull-up signal.

3. The integrated circuit of claim 1, wherein the reference voltage generation circuit comprises:
    an enable signal generation unit configured to receive a power-up signal and a self-refresh signal and generate an enable signal;
    a voltage division unit configured to divide the power supply voltage in response to the enable signal and generate the plurality of reference voltages;
    a decoder configured to decode a selection signal and generate a decoding signal; and
    a multiplexer configured to select one of the plurality of reference voltages as the input reference voltage in response to the decoding signal, wherein the multiplexer outputs the selected reference voltage as the input reference voltage when the power-up period is ended and an operation mode is not in the self-refresh mode.

4. The integrated circuit of claim 1, further comprising a data input circuit configured to buffer data in response to the input reference voltage and output the buffered data as input data.

5. The integrated circuit of claim 4, wherein the data input circuit further comprises a plurality of comparators, the plurality of comparators comprising at least:
    a first comparator configured to compare the input reference voltage with a first data and generate a first input data; and
    a second comparator configured to compare the input reference voltage with a second data and generate a second input data.

* * * * *